US011147153B2

(12) United States Patent
Long

(10) Patent No.: US 11,147,153 B2
(45) Date of Patent: Oct. 12, 2021

(54) THERMAL CONDUCTIVITY FOR INTEGRATED CIRCUIT PACKAGING

(71) Applicant: Intel Corporation, Santa Clara, CA (US)

(72) Inventor: Brian J. Long, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/905,587

(22) Filed: Jun. 18, 2020

(65) Prior Publication Data

US 2020/0323076 A1   Oct. 8, 2020

Related U.S. Application Data

(63) Continuation of application No. 16/329,200, filed as application No. PCT/US2016/054053 on Sep. 28, 2016, now Pat. No. 10,729,000.

(51) Int. Cl.
*H05K 1/02* (2006.01)
*H05K 1/09* (2006.01)
(Continued)

(52) U.S. Cl.
CPC ........... *H05K 1/0204* (2013.01); *G06F 1/181* (2013.01); *G06F 1/203* (2013.01); *H01L 23/367* (2013.01);
(Continued)

(58) Field of Classification Search
CPC ... H05K 1/02; H05K 1/09; H05K 1/11; H05K 1/18; H05K 3/30; H05K 3/36; H05K 7/10;
(Continued)

(56) References Cited

U.S. PATENT DOCUMENTS 3,911,327 A * 10/1975 Murari ................ H01L 23/4334
361/718
4,750,092 A *  6/1988 Werther ............... H01L 23/057
216/20
(Continued)

FOREIGN PATENT DOCUMENTS

EP         0959500 A2    11/1999
KR   1020080088964 A    10/2008
(Continued)

OTHER PUBLICATIONS

PCT May 11, 2017 International Search Report and Written Opinion of the International Searching Authority from International Application No. PCT/US2016/054053; 13 pages.

*Primary Examiner* — Xiaoliang Chen
(74) *Attorney, Agent, or Firm* — Patent Capital Group

(57) ABSTRACT

Aspects of the embodiments include an edge card and methods of making the same. The edge card can include a printed circuit board (PCB) comprising a first end and a second end, the first end comprising a plurality of metal contact fingers configured to interface with an edge connector, and the second end comprising a through-hole configured to mate with a post of a screw, the PCB further comprising an aperture proximate the second end of the PCB. The PCB can also include a thermal conduction element secured to the PCB, the thermal conduction element supporting an integrated circuit package, the integrated circuit package received by the aperture, wherein the thermal conduction element contacts the PCB proximate the through-hole and the thermal conduction element is configured to conduct heat from the integrated circuit towards the second portion of the printed circuit board.

14 Claims, 17 Drawing Sheets

(51) Int. Cl.

| | |
|---|---|
| H05K 1/11 | (2006.01) |
| H05K 1/18 | (2006.01) |
| H05K 3/30 | (2006.01) |
| H05K 3/36 | (2006.01) |
| H05K 7/10 | (2006.01) |
| H05K 7/20 | (2006.01) |
| H01L 23/00 | (2006.01) |
| H01L 23/12 | (2006.01) |
| H01L 23/13 | (2006.01) |
| H01L 23/22 | (2006.01) |
| H01L 23/24 | (2006.01) |
| H01L 23/28 | (2006.01) |
| H01L 23/31 | (2006.01) |
| H01L 23/34 | (2006.01) |
| H01L 23/36 | (2006.01) |
| H01L 23/40 | (2006.01) |
| H01L 23/48 | (2006.01) |
| H01L 23/498 | (2006.01) |
| H01L 23/552 | (2006.01) |
| H01L 23/367 | (2006.01) |
| G06F 1/18 | (2006.01) |
| G06F 1/20 | (2006.01) |
| H05K 1/14 | (2006.01) |
| H01L 23/427 | (2006.01) |
| H01L 23/538 | (2006.01) |

(52) U.S. Cl.
CPC ...... *H01L 23/3677* (2013.01); *H01L 23/4006* (2013.01); *H05K 1/021* (2013.01); *H05K 1/0215* (2013.01); *H05K 1/144* (2013.01); *H05K 1/181* (2013.01); *H05K 3/36* (2013.01); *H05K 7/20336* (2013.01); *H05K 7/20818* (2013.01); *H01L 23/427* (2013.01); *H01L 23/49816* (2013.01); *H01L 23/5385* (2013.01); *H01L 24/13* (2013.01); *H01L 24/16* (2013.01); *H01L 24/32* (2013.01); *H01L 24/73* (2013.01); *H01L 24/81* (2013.01); *H01L 2224/13101* (2013.01); *H01L 2224/16225* (2013.01); *H01L 2224/73253* (2013.01); *H01L 2224/81801* (2013.01); *H01L 2924/00014* (2013.01); *H01L 2924/14* (2013.01); *H01L 2924/15321* (2013.01); *H05K 1/0209* (2013.01); *H05K 2201/0367* (2013.01); *H05K 2201/042* (2013.01); *H05K 2201/064* (2013.01); *H05K 2201/066* (2013.01); *H05K 2201/1028* (2013.01); *H05K 2201/1034* (2013.01); *H05K 2201/10378* (2013.01); *H05K 2201/10393* (2013.01); *H05K 2201/10409* (2013.01); *H05K 2201/10734* (2013.01)

(58) Field of Classification Search
CPC ........... H05K 7/20; H01L 23/00; H01L 23/12; H01L 23/13; H01L 23/22; H01L 23/24; H01L 23/28; H01L 23/31; H01L 23/34; H01L 23/36; H01L 23/40; H01L 23/48; H01L 23/498; H01L 23/552
USPC ..... 361/679.47, 679.32, 688, 704, 709, 710, 361/718, 720, 767, 783; 439/66, 91, 178, 439/331; 257/99, 100, 686, 706, 774; 174/252, 257, 262, 266, 526, 528
See application file for complete search history.

(56) References Cited

U.S. PATENT DOCUMENTS

| | | | | |
|---|---|---|---|---|
| 4,868,349 | A * | 9/1989 | Chia | H01L 21/565 174/526 |
| 5,016,138 | A * | 5/1991 | Woodman | H01L 23/5385 174/252 |
| 5,037,312 | A * | 8/1991 | Casciotti | H05K 7/1061 439/66 |
| 5,158,912 | A * | 10/1992 | Kellerman | H01L 21/4867 257/706 |
| 5,566,448 | A * | 10/1996 | Bhatt | H01L 21/4857 257/E23.004 |
| 5,609,889 | A * | 3/1997 | Weber | B29C 45/14655 249/91 |
| 5,625,227 | A * | 4/1997 | Estes | H01L 23/3675 257/712 |
| 5,652,463 | A * | 7/1997 | Weber | H01L 21/565 257/706 |
| 5,838,064 | A * | 11/1998 | Shimada | H01L 23/4006 257/718 |
| 6,117,352 | A * | 9/2000 | Weaver | G01R 31/2886 216/105 |
| 6,894,384 | B1* | 5/2005 | Shizuno | H01L 23/24 257/712 |
| 2001/0012198 | A1* | 8/2001 | Ketonen | H05K 1/021 361/704 |
| 2003/0035270 | A1* | 2/2003 | Shieh | H01L 23/055 361/718 |
| 2003/0166355 | A1* | 9/2003 | Simons | H01R 13/2414 439/331 |
| 2004/0051172 | A1* | 3/2004 | Miyazaki | H01L 23/36 257/706 |
| 2004/0219807 | A1* | 11/2004 | Weiss | H01R 13/2414 439/91 |
| 2006/0006405 | A1* | 1/2006 | Mazzochette | H01L 33/641 257/99 |
| 2007/0097620 | A1 | 5/2007 | Leech et al. | |
| 2007/0240290 | A1* | 10/2007 | Liao | H01L 23/4093 24/598.1 |
| 2007/0242439 | A1* | 10/2007 | Lu | H01L 23/4006 361/719 |
| 2007/0247814 | A1* | 10/2007 | Tseng | H01L 23/4006 361/710 |
| 2008/0130238 | A1* | 6/2008 | Yang | F16B 21/086 361/719 |
| 2009/0122495 | A1* | 5/2009 | Tamura | H05K 1/0204 361/720 |
| 2009/0129024 | A1* | 5/2009 | Mahoney | H01L 23/4006 361/709 |
| 2009/0196002 | A1* | 8/2009 | Fukuzono | H05K 1/0271 361/783 |
| 2009/0237888 | A1* | 9/2009 | Chen | H01L 23/4093 361/709 |
| 2009/0257820 | A1* | 10/2009 | Hu | H01L 23/4006 403/168 |
| 2009/0325401 | A1* | 12/2009 | Sakairi | H01R 13/2435 439/66 |
| 2010/0085714 | A1* | 4/2010 | Yeh | H01L 23/4093 361/720 |
| 2010/0327419 | A1* | 12/2010 | Muthukumar | H01L 23/49816 257/686 |
| 2012/0241953 | A1 | 9/2012 | Yamada et al. | |
| 2013/0077251 | A1* | 3/2013 | Yang | G06F 1/20 361/709 |
| 2013/0083473 | A1* | 4/2013 | Mahran | G06F 1/185 361/679.32 |
| 2014/0217608 | A1* | 8/2014 | Takayama | H01L 23/4006 257/774 |
| 2015/0001731 | A1* | 1/2015 | Shuto | H01L 25/18 257/774 |
| 2015/0109738 | A1 | 4/2015 | Yamada et al. | |

(56) References Cited

U.S. PATENT DOCUMENTS

2015/0235991 A1* 8/2015 Gu .................... H01L 24/17
                                                    257/762
2019/0057940 A1* 2/2019 Cheah ................ H01L 25/0652

FOREIGN PATENT DOCUMENTS

WO         03090278 A2    10/2003
WO      2018063171 A1     4/2018

* cited by examiner

THERMAL CONDUCTIVITY FOR INTEGRATED CIRCUIT PACKAGING

CROSS-REFERENCE TO RELATED APPLICATIONS

This application is a continuation of U.S. patent application Ser. No. 16/329,200, filed Feb. 27, 2019 and titled "THERMAL CONDUCTIVITY FOR INTEGRATED CIRCUIT PACKAGING," which is a national stage application under 35 U.S.C. § 371 of PCT International Application Serial No. PCT/US2016/054053, filed on Sep. 28, 2016 and entitled "THERMAL CONDUCTIVITY FOR INTEGRATED CIRCUIT PACKAGING." These applications are hereby incorporated by reference herein in their entireties.

TECHNICAL FIELD

This disclosure pertains to thermal conductivity for integrated circuit packaging.

BACKGROUND

Electronic devices need to provide more functionality at an ever shrinking form factor. FIG. 1 is a schematic diagram of a top view 100 of an edge card 101 with a gum-stick form factor. The edge card has a "gum-stick" form factor, such as that of an m.2 form factor. The "gum-stick" form factor edge-card connection allows for hardware swapping and upgrades, and has a thickness and X-Y footprint that takes up valuable real estate in the device. The edge card 101 includes a printed circuit board 102. The edge card 101 includes circuit components 104a and 104b, which can be ASICs, DRAM, other memory elements, etc. The edge card 101 also includes passive circuit components 108a, 108b, and 108c. The edge card 101 can also include a plurality of metal contact fingers 106, which can electrically connect various circuit components to an edge connector.

BRIEF DESCRIPTION OF THE DRAWINGS

It is understood that the drawings are not drawn to scale and are for illustrative purposes. In addition, in the drawings, like reference numerals designate corresponding parts throughout the several views.

DETAILED DESCRIPTION

Figure 1:
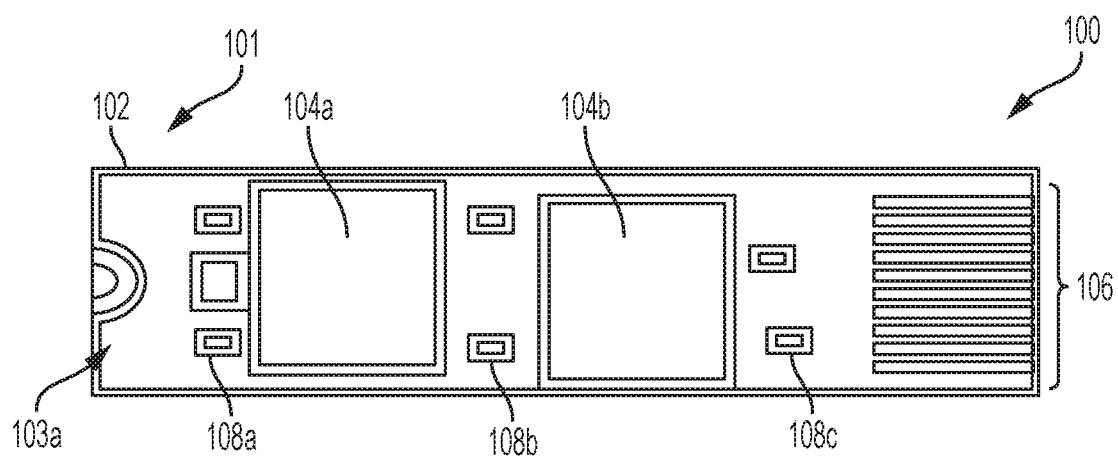
FIG. 1 is a schematic diagram of a top view of an edge card with a gum-stick form factor.

In the packaging layout shown in FIG. 1, heat-sensitive components are placed as far away as possible from heat generating components. For example, components such as NAND-based circuits, DRAM packages, etc., are placed as far from the ASIC packages as possible. The need to separate components limits layout possibilities, particularly when small form factor (SFF) products are desired.

Described herein are systems of a thermal conduction pathway for integrated circuit packaging and methods for making the same. This disclosure makes use of a combination of an aperture in a printed circuit board assembly (PCBA) into which a hot component such as a flip-chip ASIC can be received, a ball grid array (BGA) interposer onto which a flip-chip ASIC can be placed, and heat slugs (such as copper-cooling tracks/blocks) that can be placed on either side of the ASIC. This combination of features facilitates placing more components in close proximity to hotter components, such as an ASIC (and, in embodiments, on top of the ASIC).

The aspects of this disclosure can help to remove excessive heat that can disrupt the ASIC(s) and other components such as NAND devices that are often used in Small Form Factor (SFF) Printed Circuit Assemblies (PCBAs). Additionally, aspects of the disclosure facilitate stacking of active components on top of other, hotter components.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Figure 2A:
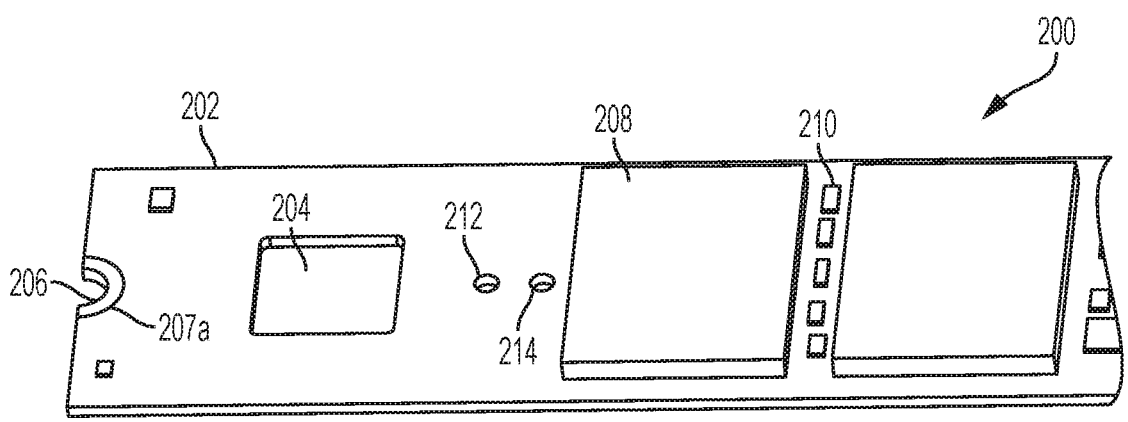
FIG. 2A is a schematic diagram of a printed circuit board in accordance with embodiments of the present disclosure.

FIG. 2A is a schematic diagram of an edge card 200 having a printed circuit board 202 in accordance with embodiments of the present disclosure. The printed circuit board (PCB) 202 can be an m.2 PCB. PCB 202 includes an aperture 204 through which an ASIC die or other integrated circuit package can be received. The PCB 202 can also include a through-hole 206. The through-hole 206 can be substantially semi-circular, a near complete circular through-hole, or can be a fully circular hole located within the area of the PCB 202 and proximate the edge of the PCB 202. The through-hole 206 can be a plated through-hole with a top grounding pad 207a. The through-hole 206 is configured to mate with a screw post for attachment to a chassis for structural support when the edge card 200 is connected to an edge connector. The grounding pad 207a can provide thermal conductivity for the edge card into the chassis. The hole can also be a complete hole—instead of just the partial hole shown in FIG. 2A.

The edge card 200 can include one or more active circuit components 208 mounted onto the PCB 202. Active circuit components 208 can include memory components or other high value devices. The edge card 200 can also include one or more passive components 210 mounted onto the PCB 202. Passive components 210 can include resistors, capacitors, inductors, etc.

The PCB 202 can also include holes to receive locking push pins to hold the far end of the heat slugs. For example, in embodiments, the PCB 202 can include a first attachment hole 212 to receive a locking push pin to support a top-side heat slug. In embodiments, the PCB 202 can include a second attachment hole 214 to receive a locking push pin to support a bottom-side heat slug. One or both attachment holes can be used depending on the number and configuration of heat slugs that are used.

Figure 2B:
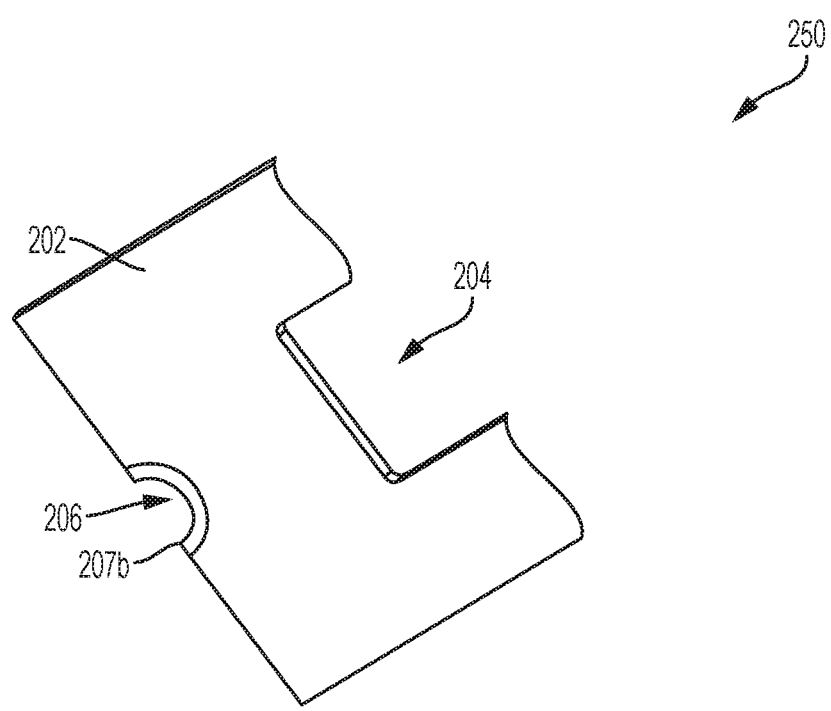
FIG. 2B is a schematic diagram of a bottom side of a printed circuit board in accordance with embodiments of the present disclosure.

FIG. 2B is a schematic diagram of a bottom side 250 of a printed circuit board 202 in accordance with embodiments of the present disclosure. FIG. 2B shows the through-hole 206 and a bottom side grounding pad 207b. The grounding pad 207b can provide thermal conductivity for the edge card into the chassis.

Figure 3:
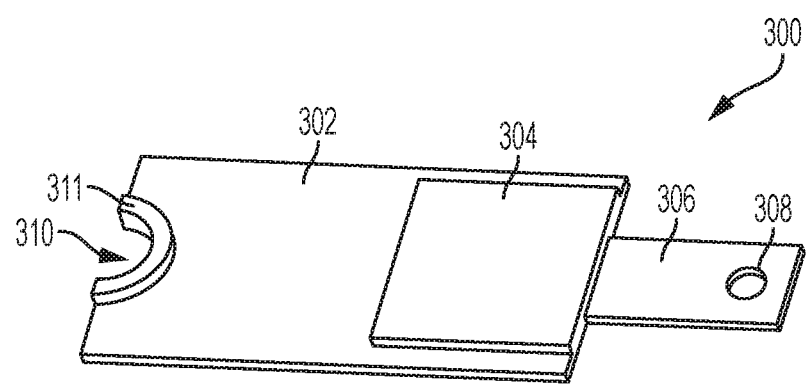
FIG. 3 is a schematic diagram of an example heat slug in accordance with embodiments of the present disclosure.

FIG. 3 is a schematic diagram of an example heat slug 300 in accordance with embodiments of the present disclosure. In embodiments, heat slug 300 can be a "top-side" heat slug that contacts a top-side of an integrated circuit package, shown in FIGS. 5, 6, 7, and 9A-B, for example.

FIG. 3 shows the bottom side of the heat slug 300. The heat slug 300 includes a main body 302. A protrusion 304 protrudes from the main body 302. Protrusion 304 is designed to be located and sized to contact and cover an integrated circuit package received by the aperture 204 of PCB 202. The heat slug 300 includes an attachment body 306 extending from the main body 302. The attachment body 306 includes an attachment hole 308 that can receive a locking push pin for securing the heat slug to the PCB 202. The heat slug 300 also includes a through-hole 310 for receiving a portion of a screw post for securing the heat slug 300 with the PCB 202 to a chassis. The main body 302 also includes a grounding pad 311 proximate the through-hole 310 that is shaped similarly to the through-hole. The grounding pad 311 can enhance thermal conduction through the PCB 202 into the chassis.

The heat slug 300 can be formed from copper or other high-conductivity materials.

Figure 4:
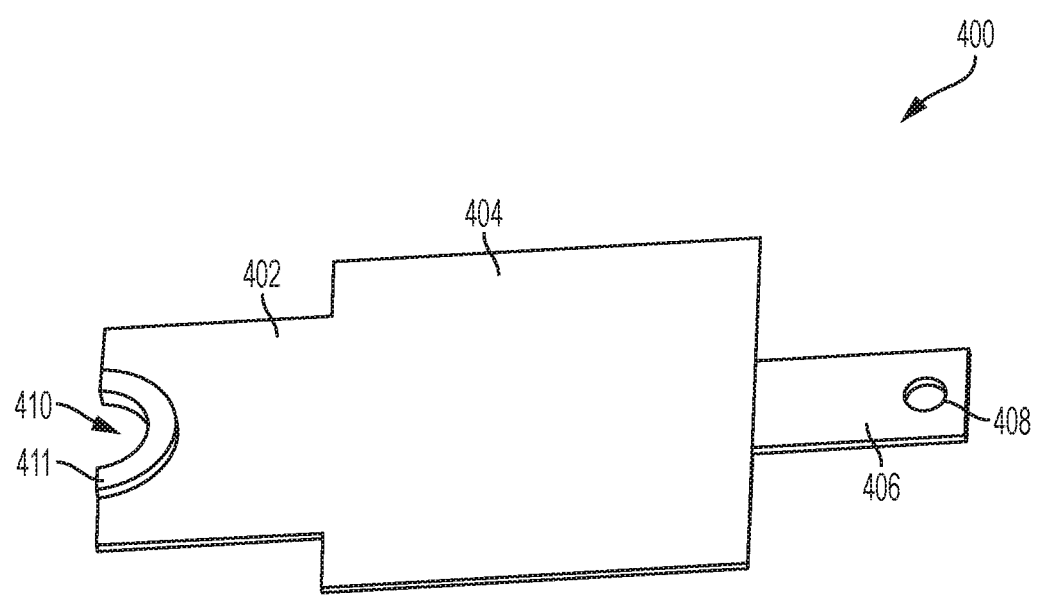
FIG. 4 is a schematic diagram of another example heat slug in accordance with embodiments of the present disclosure.

FIG. 4 is a schematic diagram of another example heat slug in accordance with embodiments of the present disclosure. The heat slug 400 includes a main body 402. The main body 402 includes an interposer receiving area 404. Interposer receiving area 404 can be sized and shaped so that a substrate interposer can reside on the surface of the interposer receiving area 404. The interposer receiving area 404 allows for thermal conduction from a substrate interposer into the chassis through the heat slug 400. The heat slug 400 includes an attachment body 406 extending from the interposer receiving area 404. The attachment body 406 includes an attachment hole 408 that can receive a locking push pin for securing the heat slug 400 to the PCB 202. The heat slug 400 also includes a through-hole 410 for receiving a portion of a screw post for securing the heat slug 400 with the PCB 202 to a chassis. The main body 402 also includes a grounding pad 411 proximate the through-hole 410 that is shaped similarly to the through-hole. The grounding pad 411 can enhance thermal conduction through the PCB 202 into the chassis.

The heat slug 400 can be formed from copper or other high-conductivity materials.

Figure 5:
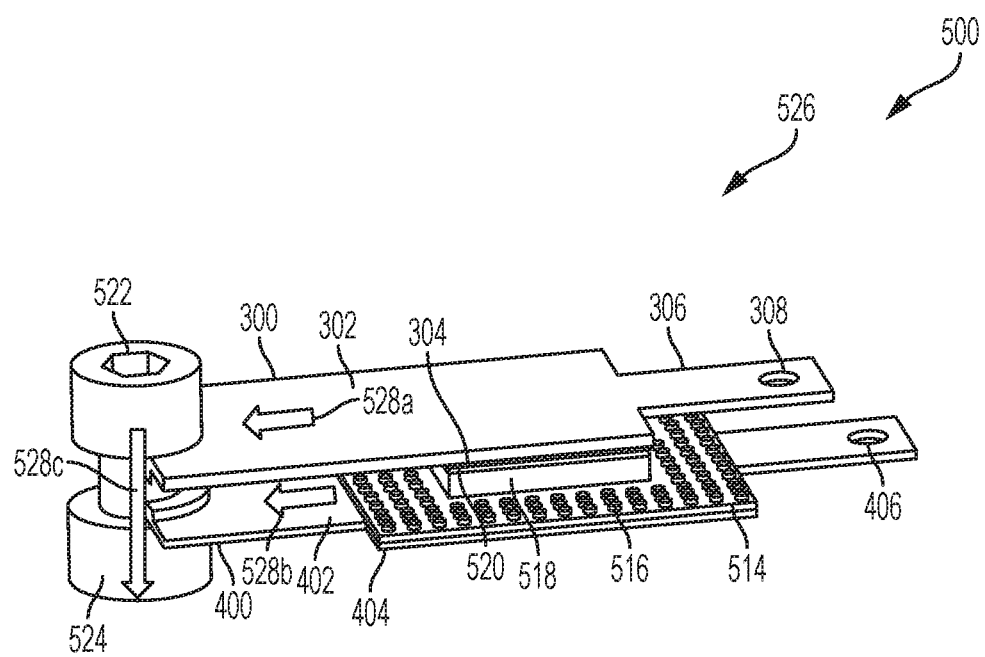
FIG. 5 is a schematic diagram of an integrated circuit package between two heat slugs in accordance with embodiments of the present disclosure.

FIG. 5 is a schematic diagram 500 of an integrated circuit package 518 between two heat slugs in accordance with embodiments of the present disclosure. In FIG. 5, the PCB 202 is hidden from view to illustrate how the integrated circuit is contacted by the heat slugs. A bottom-side heat slug 400 can contact a substrate interposer 514. A thermal interface material (not shown in FIG. 5) of adequate thickness may exist between the heat slug 400 and the bottom side of substrate interposer 514 to form a good thermal path. The substrate interposer 514 can include a plurality of solder balls 516 patterned in a ball grid array. An integrated circuit package 518, such as an ASIC package, can be attached onto the substrate interposer 514. The substrate interposer 514 would also be electrically connected to the (hidden) PCB 202 through the solder balls and trace routing, which can thereby electrically connect the integrated circuit package 518 to the circuit elements on the PCB 202.

A top-side heat slug 300 can interface with the integrated circuit package 518 by contacting the integrated circuit package 518 or, when used, by contacting the thermal interface material 520. The top-side heat slug 300 includes a protrusion 304 that has a thickness that can ensure that the heat slug 300 makes contact with the integrated circuit package 518 or the thermal interface material 520.

In embodiments, a thermal interface material 520 can reside on the integrated circuit package 518. The thermal interface material 520 can help increase thermal conduction from the integrated circuit package 518 to the top-side heat slug 300. the thermal interface material can be a thermal grease, or a thermal gel—both of which are high viscosity and would not easily flow out of the region in which they are placed. Because they can flow when under pressure they would make good (intimate) contact with the threads on the screw and the "half barrel" metal hole on the end of the gum-stick PCB. The thermal interface material could also be applied under the head of the screw and the top of the gum-stick PCB. It also could be applied between the underside of the gum-stick PCB where it rests on the metal standoff to provide and additional heat conduction path. A fully circular mounting hole instead of the "half barrel" hole shown here can also be used.

The top-side heat slug 300 and the bottom-side heat slug 400 mate with a post of a screw 522 for securing the heat slugs and the PCB 202 to the (metal) chassis 526 through a metal stand-off 524. The mating also provides a thermal conduction path from the PCB elements to the chassis 526. The direction of heat conduction is illustrated by large arrows. In the top-side heat slug 300, the thermal conduction direction 528a is towards the screw 522. Likewise, in the bottom-side heat slug 400, the thermal conduction direction 528b is towards the screw 522. The thermal conduction direction 528c in the screw is towards the chassis.

Figure 6:
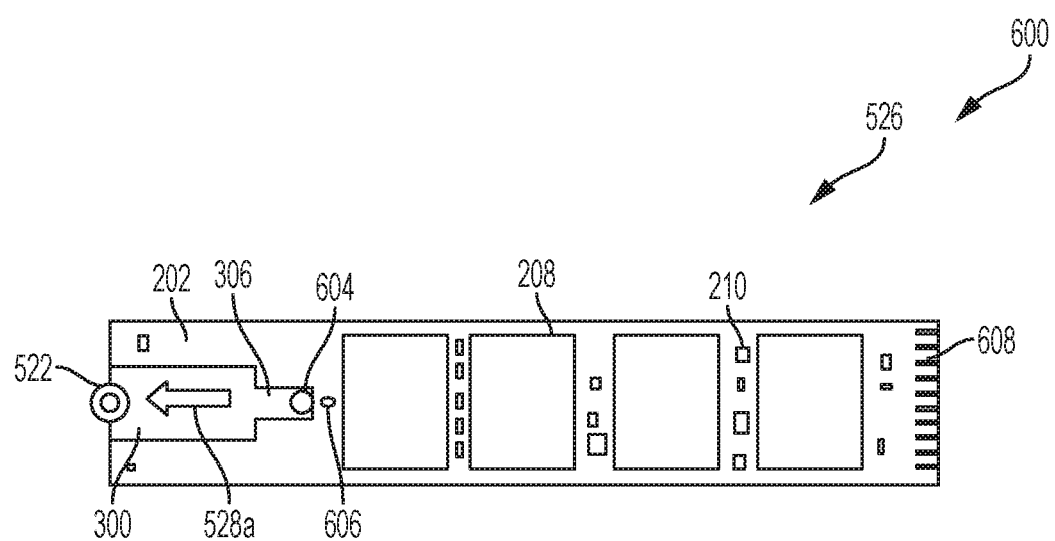
FIG. 6 is a schematic diagram of a top view of an edge card in accordance with embodiments of the present disclosure.

FIG. 6 is a schematic diagram of a top view of an edge card 600 in accordance with embodiments of the present disclosure. In FIG. 6, a top-down view of the edge card 600 is illustrated. The edge card 600 is similar to the edge card 200 described in FIGS. 2A-B. Edge card 600 includes the heat slugs 300 and 400, substrate interposer 514, solder balls 516, the integrated circuit package 518, and can also include the thermal interface material 520, as shown in FIG. 5. The edge card 600 also includes the active circuit components 208 and passive circuit components 210. Edge card 600 is also shown to include metal contact fingers 608, which can electrically connect circuit components on the edge card 600 with other circuits, devices, etc., through an edge connector. The edge card 600 is shown to be screwed into a chassis 526 by screw 522. The top-side heat slug 300 is secured to the PCB 202 by a locking push pin 604. The bottom-side heat slug (not shown in FIG. 6) is secured to the PCB 202 by a locking push pin 606. The stand-off 524 and the locking push pin 606 can cause the bottom-side heat slug 400 to press against the substrate interposer 514 when the screw 522 is screwed down into the chassis 526. Similarly, screwing the top-side heat slug 604 with screw 522 and securing the heat slug 300 with locking push pin 604 can press the protrusion 304 onto the integrated circuit package 518, whether directly or indirectly via the thermal interface material 520.

Figure 7:
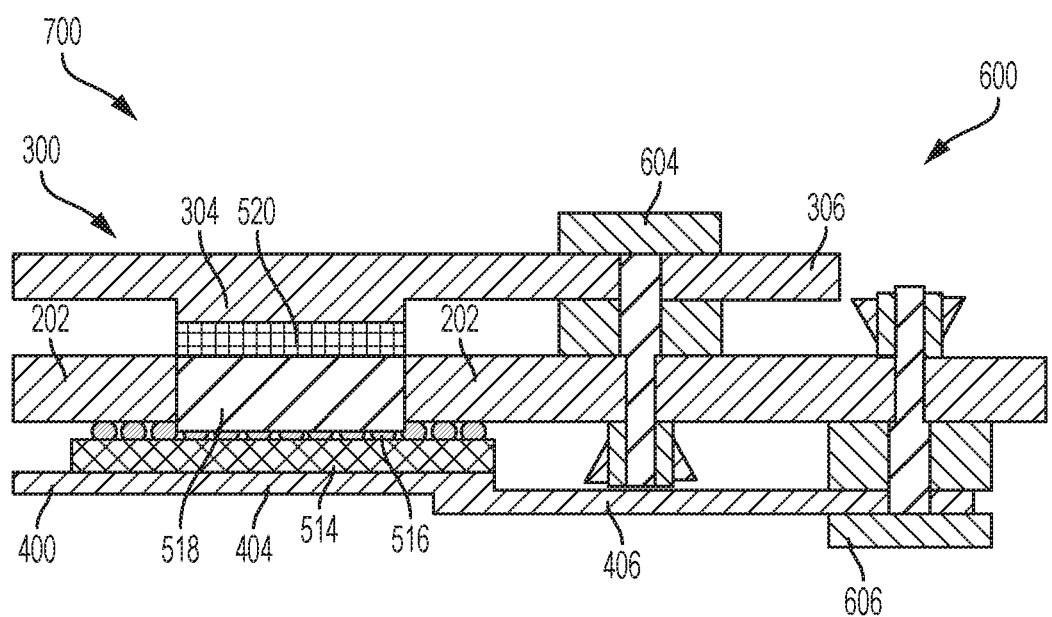
FIG. 7 is a schematic diagram of a cross-sectional view of an edge card in accordance with embodiments of the present disclosure.

FIG. 7 is a schematic diagram of a cross-sectional view 700 of an edge card in accordance with embodiments of the present disclosure. FIG. 7 illustrates a cross-sectional view 700 of a portion of the edge card 600 of FIG. 6. The cross-sectional view 700 illustrates how the integrated circuit package 518 can be received through the aperture 204 of the PCB 202. The top-side heat slug 300 includes a protrusion 304 that presses down onto the integrated circuit package 518 (as shown in FIG. 7, the protrusion 304 presses down onto a thermal interface material 520, which in turn presses down onto the integrated circuit package 518). The top-side heat slug 300 is secured to the PCB 202 by locking push pin 604, which mates with the top-side heat slug 300 by an attachment hole on the attachment body 306.

The bottom-side heat slug 400 includes an interposer receiving body 404 that contacts a substrate interposer 514. The substrate interposer 514 includes a plurality of solder balls 516 that are patterned as a ball grid array. Some of the solder balls 516 form an electrical contact with the integrated circuit package 518 and connect the integrated circuit package 518 electrically with traces in the substrate interposer 514. Some of the solder balls 516 form electrical contact with the circuit elements on the PCB 202 (such as active circuit element 208) through traces in the substrate interposer 514 and through traces in the PCB 202. These solder balls 516 on the interposer 514 also form a mechanical connection between the interposer 514 and PCB 202 to hold it in place.

The bottom-side heat slug 400 is secured to the PCB 202 by a locking push pin 606, which mates with the bottom-side heat slug 400 by an attachment hole on the attachment body 406.

Figure 8A:
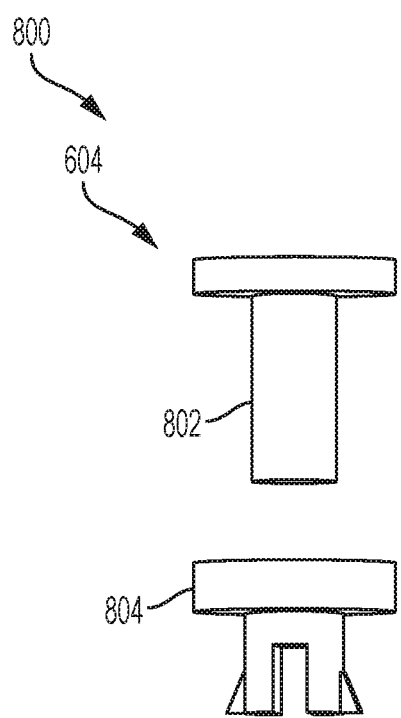
FIG. 8A is a schematic diagram of an exploded view of a locking push pin in accordance with embodiments of the present disclosure.
Figure 8B:
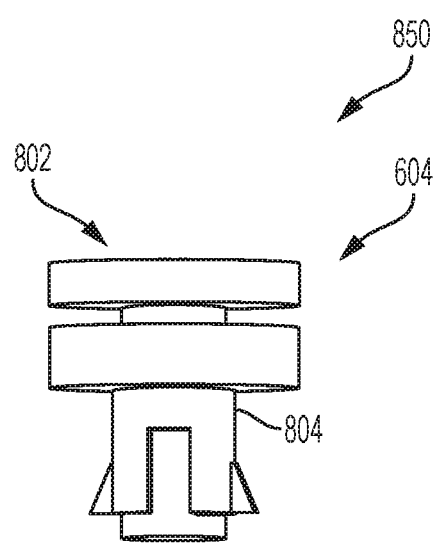
FIG. 8B is a schematic diagram of an assembled view of a locking push pin in accordance with embodiments of the present disclosure.

FIG. 8A is a schematic diagram of an exploded view 800 of a locking push pin 606 in accordance with embodiments of the present disclosure. FIG. 8B is a schematic diagram of an assembled view 850 of a locking push pin 604 in accordance with embodiments of the present disclosure. The locking push pin 604 includes a top push pin 802 that is received by a base locking piece 804. The top push pin 802 can be held in place in the base locking piece 804 by a friction fit or wedge fit wherein the base locking piece locks underneath the PCB 202 after it is expanded or wedged open by top push pin 802. Locking push pin 606 described above can be the same or similar design as locking push pin 604 shown in FIGS. 8A-B.

Figure 9A:
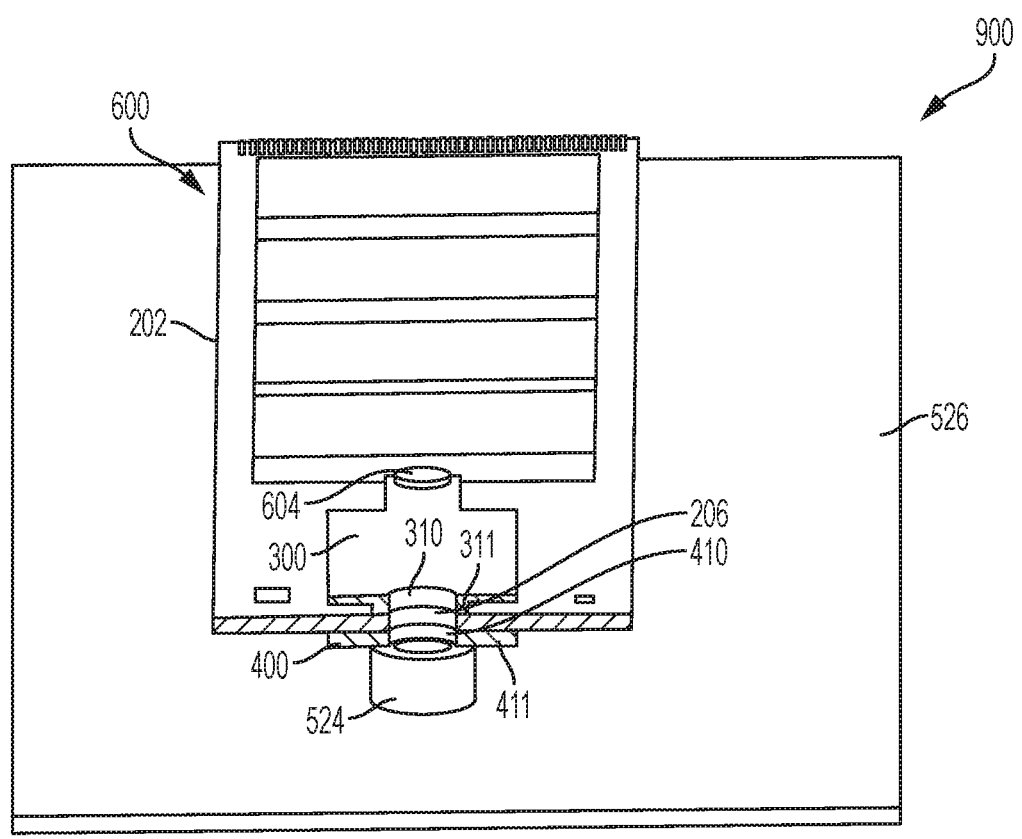
FIGS. 9A-9B are a schematic diagram of an edge card mounting position on a chassis by a screw in accordance with embodiments of the present disclosure.

FIG. 9A is a schematic diagram of an edge card mounting position in accordance with embodiments of the present disclosure. The PCB 202 can include a through-hole 206. The through-hole 206 can be a plated through-hole with a top grounding pad 207a and a bottom grounding pad 207b. The through-hole 206 is configured to mate with a screw post for attachment to a chassis 526 for structural support when the edge card 200 is connected to an edge connector. The grounding pad 207a and grounding pad 207b can provide thermal conductivity for the edge card into the chassis 526.

The bottom-side heat slug 400 can be secured to the PCB 202 by a locking push pin 606 (not shown in FIG. 9A). The bottom-side heat slug 400 can contact the stand-off 524 when the screw is placed through-holes 310, 410 and 206. The grounding pad 411 can contact the PCB grounding pad 207b when the screw is placed through-holes 310, 410 and 206. Likewise, the top-side heat slug 300 can be secured to the PCB 202 via locking push pin 604. The grounding pad 311 can contact the PCB grounding pad 207a when the screw is placed through-holes 310, 410 and 206.

Figure 9B:
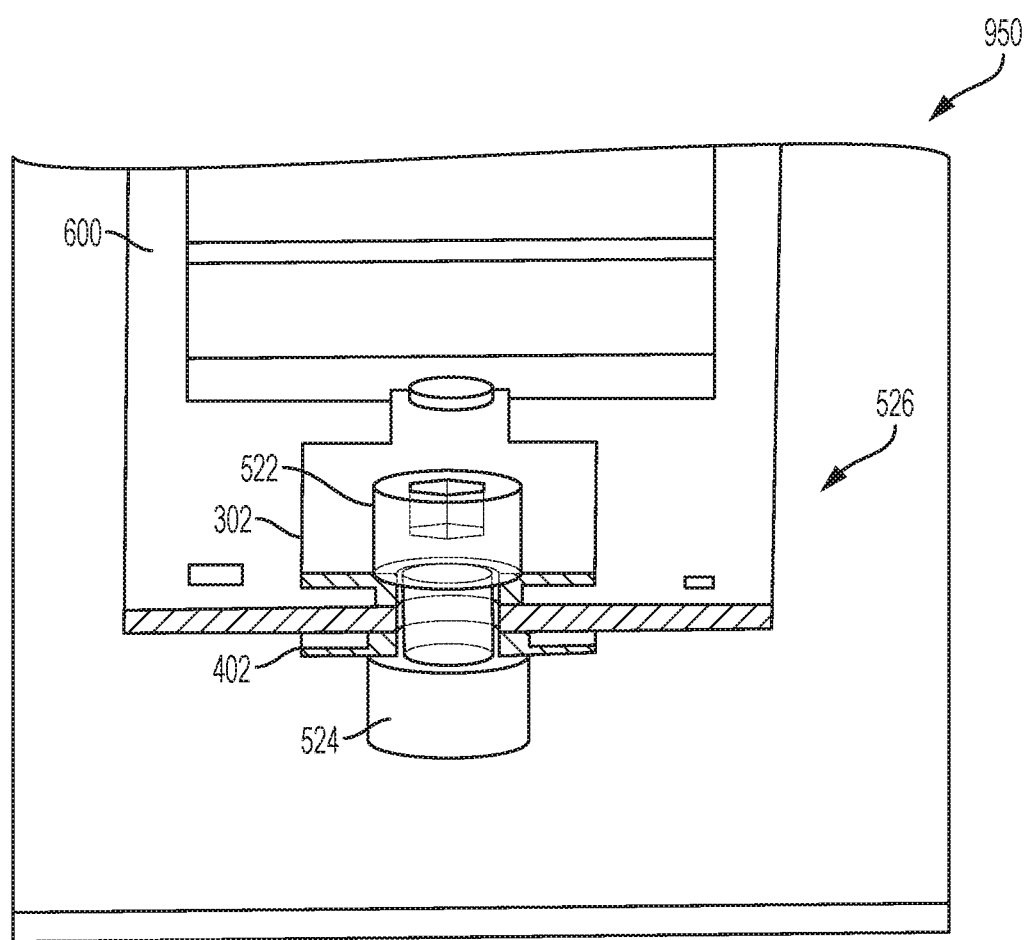

The through-holes 310, 410, and 206 are aligned and positioned about the stand-off 524 so that the through-holes 310, 410, and 206 can receive a post of a screw, shown in FIG. 9B.

FIG. 9B is a schematic diagram of an edge card mounting position on a chassis 526 by a screw 522 in accordance with embodiments of the present disclosure. The screw 522 is received by the through-holes 310, 410, and 206 and into the stand-off 524. The screw 522 are designed to mate with threads in the stand-off 524. The screw and stand-off provide a thermal conduction pathway for heat to flow from the integrated circuit package 518 into the chassis 526.

Figure 10:
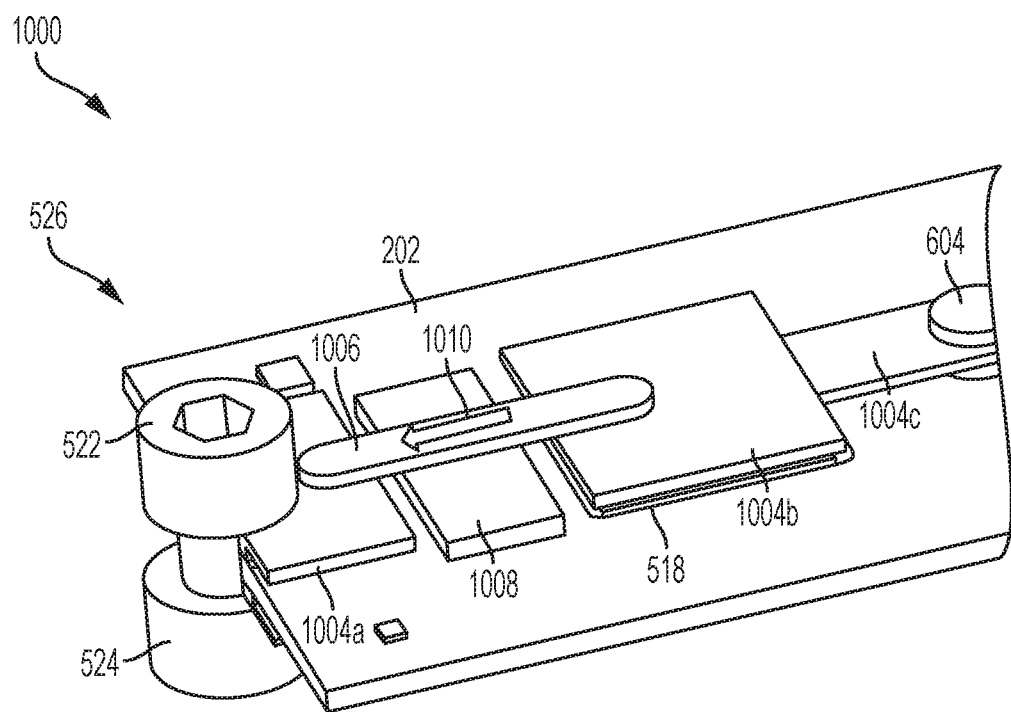
FIG. 10 is a schematic diagram of an edge card using a heat pipe for thermal conductivity in accordance with embodiments of the present disclosure.

FIG. 10 is a schematic diagram of an edge card 1000 using a heat pipe 1006 for thermal conductivity in accordance with embodiments of the present disclosure. Edge card 1000 can be similar to edge cards 200 and 600. The edge card 1000 includes a heat pipe 1006 for thermal conduction, instead of a top-side heat slug 300. The heat pipe 1006 can be connected to a first heat slug 1004a that includes a through-hole for mating to a screw 522 in a similar way as heat slug 300 described above. The heat pipe 1006 can also be connected to a second heat slug 1004b that includes a protrusion 1004d (shown in FIG. 11) that can contact the integrated circuit package 518 (e.g., through a thermal interface material 520). The heat slug 1004b is connected to an attachment body 1004c (FIG. 10) that includes a through-hole for receiving a locking push pin 604. Heat conduction direction 1010 is indicated by an arrow pointing towards the screw 522, and heat conduction follows the same path through the screw 522, stand-off 524, and into the chassis 526.

The use of a heat pipe 1006 can permit a larger vertical space between the heat pipe 1006 and the PCB 202. This vertical space can accommodate additional circuit elements, such as circuit element 1008.

Heat slugs 1004a-c can be made from copper or other thermally conductive material. Examples of heat slug materials include aluminum, nickel, tin, and tungsten. Other example materials for the heat slug include silver, gold, graphite, and diamond. Heat pipe 1006 can also be made from copper or other thermally conductive material such as aluminum.

Figure 11:
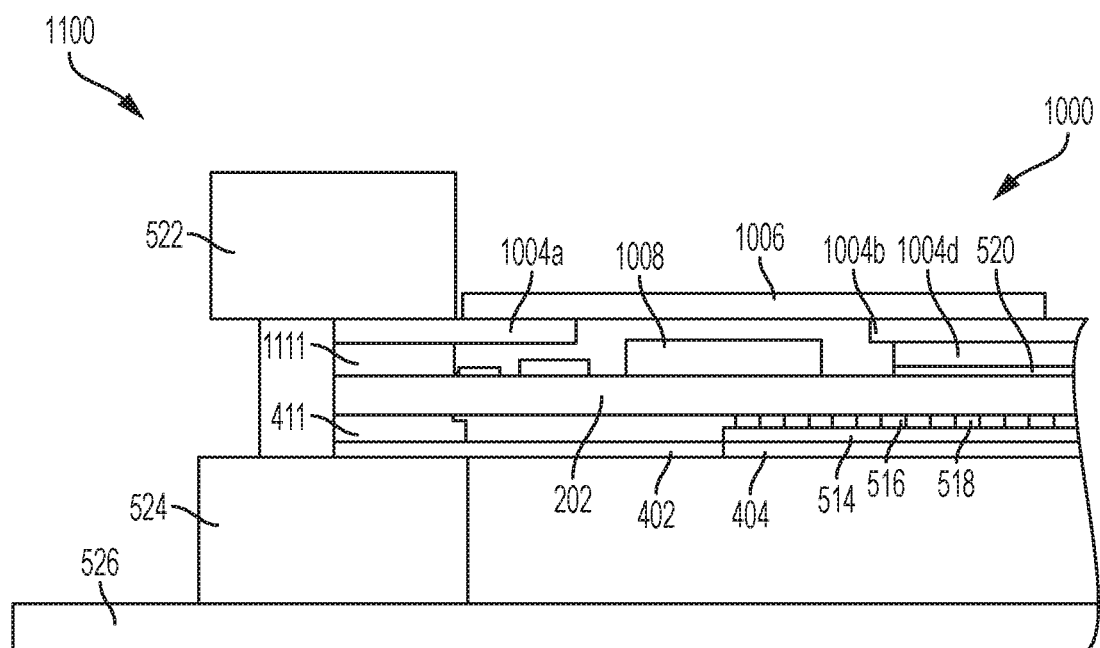
FIG. 11 is a schematic diagram of a side view of an edge card using a heat pipe for thermal conductivity in accordance with embodiments of the present disclosure.

FIG. 11 is a schematic diagram of a side view 1100 of an edge card 1000 using a heat pipe 1006 for thermal conductivity in accordance with embodiments of the present disclosure. The first heat slug 1004a is screwed down onto the PCB 202 by a screw 522. The grounding pad 1111 promotes a thermal conduction pathway for the first heat slug 1004a and for the PCB 202 into the chassis 526. The first heat slug 1004a is connected to a heat pipe 1006. The heat pipe 1006 is connected on another end to a second heat slug 1004b. The heat pipe 1006 creates a thermal conduction path for heat from the integrated circuit package 518 between the second heat slug 1004b and the first heat slug 1004a. The second heat slug 1004b includes a protrusion 1004d that presses onto the integrated circuit package 518 (e.g., by pressing down onto a thermally conductive material 520 that resides between the protrusion and the integrated circuit package).

The heat pipe 1006 has sufficient rigidity such that when the first heat slug 1004a is screwed down onto the chassis 526 and the locking push pin 604 has secured the attachment body 1004c onto the PCB 202, the protrusion 1004d presses down onto the integrated circuit package 518 (e.g., by pressing down onto a thermally conductive material 520 that resides between the protrusion and the integrated circuit package).

The heat pipe 1006 creates available space below the heat pipe 1006 between the first heat slug 1004a and the second heat slug 1004b for additional circuit components, such as circuit component 1008. Circuit component 1008 can be an active circuit component or a passive circuit component. Multiple additional circuit components can be placed in the available space to the extent that sufficient space is available, in which case the multiple circuit components can be multiple active circuit components, multiple passive circuit components, or a combination of active and passive circuit components.

The bottom-side heat slug 400 includes an interposer receiving body 404 that contacts a substrate interposer 514. The substrate interposer 514 includes a plurality of solder balls 516 that are patterned as a ball grid array. Some of the solder balls 516 form an electrical contact with the integrated circuit package 518 and connect the integrated circuit package 518 electrically with traces in the substrate interposer 514. Some of the solder balls 516 form electrical contact with the circuit elements on the PCB 202 (such as active circuit element 208) through traces in the substrate interposer 514 and through traces in the PCB 202.

The bottom-side heat slug 400 is secured to the PCB 202 by a locking push pin 606, which mates with the bottom-side heat slug 400 by an attachment hole on the attachment body 406. The bottom side heat slug 400 also includes a grounding pad 410 that contacts the PCB 202 at a PCB grounding pad 207b (grounding pad 207b is shown in FIG. 2B). The bottom side heat slug 400 contacts the stand-off 524 and is secured by the screw 522.

Figure 12A:
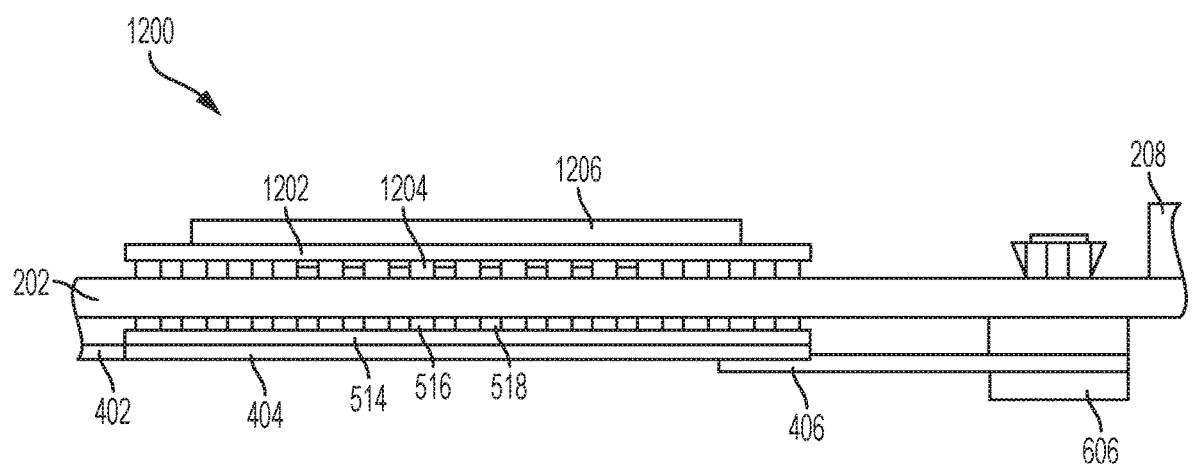
FIG. 12A is a schematic diagram of an edge card with two integrated circuit packages in a stacked configuration in accordance with embodiments of the present disclosure.

FIG. 12A is a schematic diagram of an edge card 1200 with two integrated circuit packages in a stacked configuration in accordance with embodiments of the present disclosure. Edge card 1200 does not include a top-side thermal conduction element, but does include a bottom heat slug 400. A second substrate interposer 1202 can be positioned over the integrated circuit 518. The second substrate interposer 1202 can include a plurality of solder balls 1204 patterned in a ball grid array that contacts the top side of the PCB 202 around the aperture 204. The second integrated circuit 1206 can be attached to the substrate interposer 1202. The second integrated circuit can be electrically connected to traces in the PCB 202 by the ball grid arrays on the substrate interposer 1202.

The bottom-side heat slug 400 includes an interposer receiving body 404 that contacts a substrate interposer 514. The substrate interposer 514 includes a plurality of solder balls 516 that are patterned as a ball grid array. Some of the solder balls 516 form an electrical contact with the integrated circuit package 518 and connect the integrated circuit package 518 electrically with traces in the substrate interposer 514. Some of the solder balls 516 form electrical contact with the circuit elements on the PCB 202 (such as active circuit element 208) through traces in the substrate interposer 514 and through traces in the PCB 202.

The bottom-side heat slug 400 is secured to the PCB 202 by a locking push pin 606, which mates with the bottom-side heat slug 400 by an attachment hole on the attachment body 406. The bottom side heat slug 400 also includes a grounding pad 410 that contacts the PCB 202 at a PCB grounding pad 207b (grounding pad 207b is shown in FIG. 2B). The bottom side heat slug 400 contacts the stand-off 524 and is secured by the screw 522.

Figure 12B:
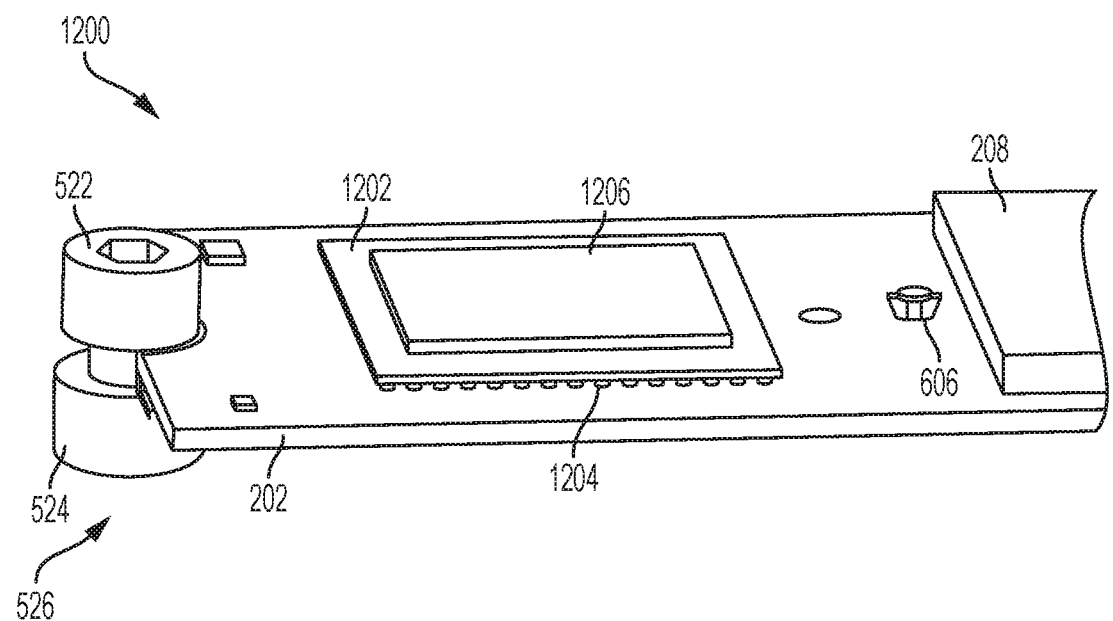
FIG. 12B is a schematic diagram of an edge card with two integrated circuit packages in a stacked configuration in accordance with embodiments of the present disclosure.

FIG. 12B is a schematic diagram of an edge card 1200 that includes two integrated circuits in accordance with embodiments of the present disclosure. FIG. 12B shows an isometric view of the edge card 1200 to illustrate the metal stand-off 524 as well as top-side components, such as circuit component 208. In FIG. 12B, the substrate interposer 1202 is shown to be electrically connected to the top-side of the PCB 202 by a ball grid array of solder balls 1204. The integrated circuit 1206 can be electrically connected to the PCB 202 and to other circuit components, such as circuit component 208, through the substrate interposer 1202.

Figure 13:
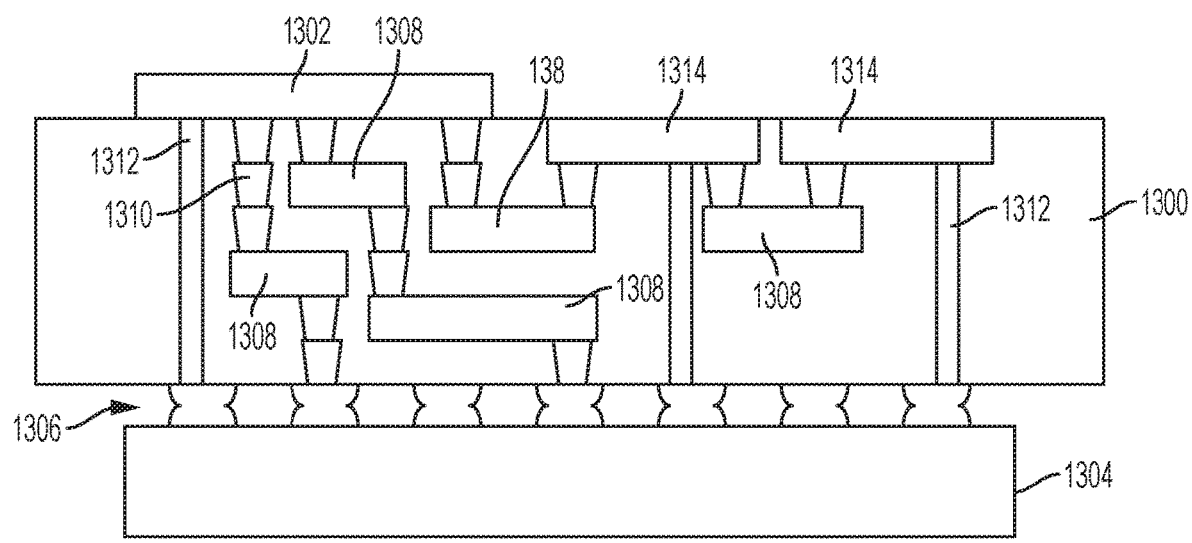
FIG. 13 is a schematic diagram of an interposer implementing one or more embodiments of the present disclosure.

FIG. 13 illustrates an interposer 1300 that includes one or more embodiments of the disclosure. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302/1304 are attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300.

In accordance with embodiments of the disclosure, apparatuses or processes disclosed herein may be used in the fabrication of interposer 1300.

Figure 14:
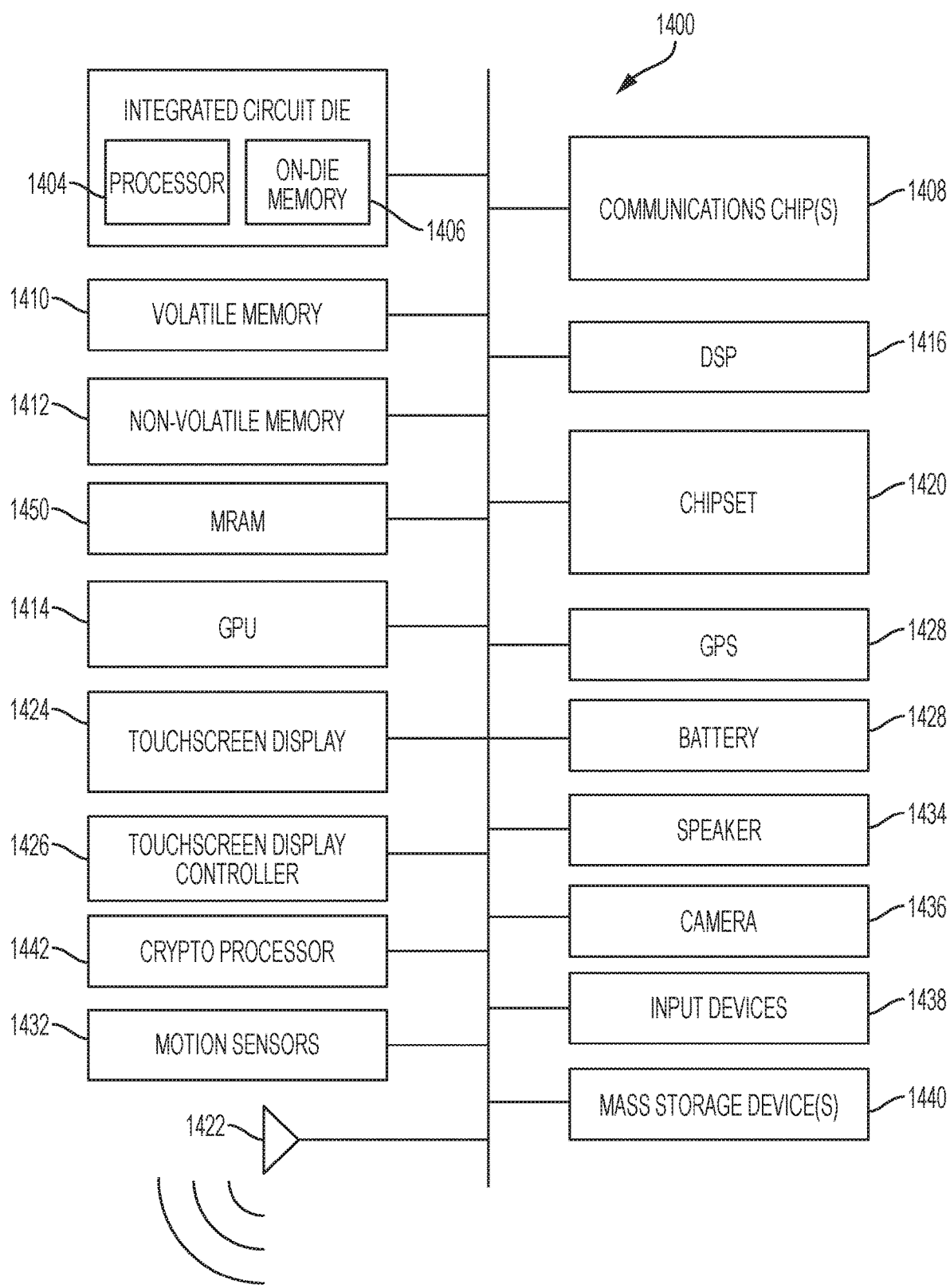
FIG. 14 is a schematic diagram of an example computing device that may connected via a linear edge connector.

FIG. 14 illustrates a computing device 1400 in accordance with one embodiment of the disclosure. The computing device 1400 may include a number of components. In one embodiment, these components are attached to one or more motherboards. In an alternate embodiment, some or all of these components are fabricated onto a single system-on-a-chip (SoC) die. The components in the computing device 1400 include, but are not limited to, an integrated circuit die 1402 and at least one communications logic unit 1408. In some implementations the communications logic unit 1408 is fabricated within the integrated circuit die 1402 while in other implementations the communications logic unit 1408 is fabricated in a separate integrated circuit chip that may be bonded to a substrate or motherboard that is shared with or electronically coupled to the integrated circuit die 1402. The integrated circuit die 1402 may include a CPU 1404 as well as on-die memory 1406, often used as cache memory, that can be provided by technologies such as embedded DRAM (eDRAM) or spin-transfer torque memory (STTM or STT-MRAM).

Computing device 1400 may include other components that may or may not be physically and electrically coupled to the motherboard or fabricated within an SoC die. These other components include, but are not limited to, volatile memory 1410 (e.g., DRAM), non-volatile memory 1412 (e.g., ROM or flash memory), a graphics processing unit 1414 (GPU), a digital signal processor 1416, a crypto processor 1442 (a specialized processor that executes cryptographic algorithms within hardware), a chipset 1420, an antenna 1422, a display or a touchscreen display 1424, a touchscreen controller 1426, a battery 1428 or other power source, a power amplifier (not shown), a voltage regulator (not shown), a global positioning system (GPS) device 1428, a compass 1430, a motion coprocessor or sensors 1432 (that may include an accelerometer, a gyroscope, and a compass), a speaker 1434, a camera 1436, user input devices 1438 (such as a keyboard, mouse, stylus, and touchpad), and a mass storage device 1440 (such as hard disk drive, compact disk (CD), digital versatile disk (DVD), and so forth).

The communications logic unit 1408 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communications logic units 1408. For instance, a first communications logic unit 1408 may be dedicated to shorter range wireless communications such as Wi-Fi and Bluetooth and a second communications logic unit 1408 may be dedicated to longer range wireless communications such as GPS, EDGE, GPRS, CDMA, WiMAX, LTE, Ev-DO, and others.

In various embodiments, the computing device 1400 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The relative sizes of features shown in the figures are not drawn to scale.

The following paragraphs provide examples of various ones of the embodiments disclosed herein.

Example 1 is an edge card that includes a printed circuit board comprising a first end and a second end, the first end comprising a plurality of metal contact fingers configured to interface with an edge connector, and the second end comprising a through-hole configured to mate with a post of a screw, the printed circuit board further comprising an aperture proximate the second end of the printed circuit board; and a thermal conduction element secured to the printed circuit board, the thermal conduction element supporting an integrated circuit package, the integrated circuit package received by the aperture, wherein the thermal conduction element contacts the printed circuit board proximate the through-hole and the thermal conduction element is configured to conduct heat from the integrated circuit towards the second portion of the printed circuit board.

Example 2 may include the subject matter of example 1, wherein the bottom side thermal conduction element is secured to the printed circuit board by a locking push pin.

Example 3 may include the subject matter of any of examples 1 or 2, wherein the thermal conduction element is a bottom-side thermal conduction element, and the edge card further comprises a top-side thermal conduction element secured to the printed circuit board, the top-side thermal conduction element comprising a protrusion that contacts the integrated circuit element.

Example 4 may include the subject matter of example 3, wherein the top-side thermal conduction element comprises a first portion proximate the through-hole of the printed circuit board and a second portion that comprises the protrusion that contacts the integrated circuit package, and wherein the first portion and the second portion are connected by a heat pipe, the heat pipe offset from the printed circuit board and forming a thermal conduction pathway between the first portion and the second portion.

Example 5 may include the subject matter of example 4, further comprising a circuit element electrically connected to the printed circuit board under the heat pipe.

Example 6 may include the subject matter of example 3, wherein the top-side thermal conduction element is secured to the printed circuit board by a locking push pin.

Example 7 may include the subject matter of example 3, further comprising a thermal interface material between the protrusion and the integrated circuit package, wherein the top-side thermal conduction element, the thermal interface material, and the screw form a thermal conduction pathway for heat to conduct from the integrated circuit package to the chassis.

Example 8 may include the subject matter of any of examples 1 or 2, further comprising an substrate interposer supported by the thermal conduction element, the substrate interposer comprising a plurality of solder balls, wherein the integrated circuit package is electrically connected to the substrate interposer by at least some of the plurality of solder balls, and wherein the substrate interposer is electrically connected to the printed circuit board by at least some of the plurality of solder balls, the integrated circuit package electrically connected to the printed circuit board through one or more traces embedded in the substrate interposer.

Example 9 may include the subject matter of any of examples 1-8, wherein the integrated circuit package is a first integrated circuit package, wherein the edge card further comprises a substrate interposer soldered to the printed circuit board in a location above the integrated circuit package, the substrate interposer comprising a solder ball grid array patterned to surround the aperture on the printed circuit board; and a second integrated circuit package soldered to the substrate interposer.

Example 10 may include the subject matter of any of examples 1-9, wherein the printed circuit board further comprises at least one attachment hole, the aperture between the through-hole and the at least one attachment hole, the attachment hole configured to receive a locking push pin to secure the thermal conduction element to the printed circuit board.

Example 11 may include the subject matter of any of examples 1-10, further comprising a circuit element soldered to the printed circuit board at a location between the aperture and the metal contact fingers.

Example 12 may include the subject matter of example 11, wherein the integrated circuit package is electrically connected to the circuit element soldered to the printed circuit board through a substrate interposer supported by the thermal conduction element.

Example 13 is a computing device comprising a processor mounted on a substrate; a communications logic unit within the processor; a memory within the processor; a graphics processing unit within the computing device; an antenna within the computing device; a display on the computing device; a battery within the computing device; a power amplifier within the processor; a voltage regulator within the processor; and a metal chassis housing one or more printed circuit boards. The computing device comprises an edge card. The edge card may include a printed circuit board comprising a first end and a second end, the first end comprising a plurality of metal contact fingers configured to interface with an edge connector, and the second end comprising a through-hole configured to mate with a post of a screw, the printed circuit board further comprising an aperture proximate the second end of the printed circuit board; and a thermal conduction element secured to the printed circuit board, the thermal conduction element supporting an integrated circuit package, the integrated circuit package received by the aperture, wherein the thermal conduction element contacts the printed circuit board proximate the through-hole and the thermal conduction element is configured to conduct heat from the integrated circuit towards the second portion of the printed circuit board.

Example 14 may include the subject matter of example 13, wherein the bottom side thermal conduction element is secured to the printed circuit board by a locking push pin.

Example 15 may include the subject matter of any of examples 13 or 14, wherein the thermal conduction element is a bottom-side thermal conduction element, and the edge card further comprises a top-side thermal conduction element secured to the printed circuit board, the top-side thermal conduction element comprising a protrusion that contacts the integrated circuit element.

Example 16 may include the subject matter of example 15, wherein the top-side thermal conduction element comprises a first portion proximate the through-hole of the printed circuit board and a second portion that comprises the protrusion that contacts the integrated circuit package, and wherein the first portion and the second portion are connected by a heat pipe, the heat pipe offset from the printed circuit board and forming a thermal conduction pathway between the first portion and the second portion.

Example 17 may include the subject matter of example 16, further comprising a circuit element electrically connected to the printed circuit board under the heat pipe.

Example 18 may include the subject matter of example 15, wherein the top-side thermal conduction element is secured to the printed circuit board by a locking push pin.

Example 19 may include the subject matter of example 15, further comprising a thermal interface material between the protrusion and the integrated circuit package, wherein the top-side thermal conduction element, the thermal interface material, and the screw form a thermal conduction pathway for heat to conduct from the integrated circuit package to the chassis.

Example 20 may include the subject matter of example 15, wherein the top-side thermal conduction element, the bottom-side thermal conduction element, and the printed circuit board are affixed to a chassis by a screw, and wherein the bottom-side thermal conduction element and the screw form a thermal conduction pathway for heat to conduct from a bottom side of the integrated circuit package to the chassis; and wherein the top-side thermal conduction element is affixed to the chassis by the screw, and wherein the top-side thermal conduction element and the screw form a thermal conduction pathway for heat to conduct from a top side of the integrated circuit package to the chassis.

Example 21 may include the subject matter of any of examples 13 or 14, further comprising an substrate interposer supported by the thermal conduction element, the substrate interposer comprising a plurality of solder balls, wherein the integrated circuit package is electrically connected to the substrate interposer by at least some of the plurality of solder balls, and wherein the substrate interposer is electrically connected to the printed circuit board by at least some of the plurality of solder balls, the integrated circuit package electrically connected to the printed circuit board through one or more traces embedded in the substrate interposer.

Example 22 may include the subject matter of any of examples 13 or 14, wherein the integrated circuit package is a first integrated circuit package, wherein the edge card further comprises a substrate interposer soldered to the printed circuit board in a location above the integrated circuit package, the substrate interposer comprising a solder ball grid array patterned to surround the aperture on the printed circuit board; and a second integrated circuit package soldered to the substrate interposer.

Example 23 may include the subject matter of any of examples 13 or 14, wherein the printed circuit board further comprises at least one attachment hole, the aperture between the through-hole and the at least one attachment hole, the attachment hole configured to receive a locking push pin to secure the thermal conduction element to the printed circuit board.

Example 24 may include the subject matter of any of examples 13 or 14, further comprising a circuit element soldered to the printed circuit board at a location between the aperture and the metal contact fingers.

Example 25 may include the subject matter of example 24, wherein the integrated circuit package is electrically connected to the circuit element soldered to the printed circuit board through a substrate interposer supported by the thermal conduction element.

Example 26 is a method comprising providing a printed circuit board comprising an aperture proximate to a first end of the printed circuit board; providing a thermal conduction element, the thermal conduction element supporting an integrated circuit package on a substrate interposer; and attaching the thermal conduction element to the printed circuit board, the integrated circuit package received by the aperture.

Example 27 may include the subject matter of example 26, further comprising: providing the substrate interposer; providing the integrated circuit package; soldering the integrated circuit package to the substrate interposer via ball grid array; and soldering one or more solder balls on the ball grid array to a bottom side of the printed circuit board.

Example 28 may include the subject matter of any of examples 26-27, wherein the integrated circuit package is a first integrated circuit package and the substrate interposer is a first interposer, the method further comprising providing a second substrate interposer above the aperture and electrically connected to a top-side of the printed circuit board; and providing a second integrated circuit on the second substrate interposer, the second integrated circuit electrically connected to the printed circuit board through the second substrate interposer.

Example 29 may include the subject matter of any of examples 26-27, wherein the thermal conduction element is a bottom-side thermal conduction element attached to a bottom side of the printed circuit board, the method further comprising providing a top-side thermal conduction element comprising a protrusion; and attaching the top-side thermal conduction element to a top side of the printed circuit board, the protrusion contacting the integrated circuit package received by the aperture.

Example 30 may include the subject matter of example 29, wherein the top-side thermal conduction element comprises a heat pipe offset from the printed circuit board, the method further comprising providing a circuit component on the printed circuit board in a location beneath the heat pipe.

What is claimed is:

1. An integrated circuit assembly, comprising:
   a printed circuit board having a through-hole to mate with a post, wherein the printed circuit board has an aperture proximate the through-hole;
   a bottom-side thermal conduction element secured to the printed circuit board, wherein the bottom-side thermal conduction element supports an integrated circuit package, the integrated circuit package extends into the aperture, and the bottom-side thermal conduction element contacts the printed circuit board proximate the through-hole; and
   a top-sided thermal conduction element secured to the printed circuit board, the top-side thermal conduction element including a protrusion that contracts the integrated circuit package.

2. The integrated circuit assembly of claim 1, wherein the bottom-side thermal conduction element is secured to the printed circuit board by a locking push pin.

3. The integrated circuit assembly of claim 1, wherein the top-side thermal conduction element includes a first portion proximate the through-hole of the printed circuit board and a second portion that includes the protrusion that contacts the integrated circuit package, and wherein the first portion and the second portion are connected by a heat pipe that is offset from the printed circuit board.

4. The integrated circuit assembly of claim 1, further comprising a circuit element electrically connected to the printed circuit board under the heat pipe.

5. The integrated circuit assembly of claim 1, wherein the top-side thermal conduction element is secured to the printed circuit board by a locking push pin.

6. The integrated circuit assembly of claim 2, further comprising a thermal interface material between the protrusion and the integrated circuit package.

7. The integrated circuit assembly of claim 1, further comprising:
   a substrate interposer supported by the bottom-side thermal conduction element, wherein the integrated circuit package is electrically connected to the substrate interposer by first solder balls, the substrate interposer is electrically connected to the printed circuit board by second solder balls, and the integrated circuit package is electrically connected to the printed circuit board at least partially through one or more traces embedded in the substrate interposer.

8. The integrated circuit assembly of claim 7, wherein the first solder balls and the second solder balls are on a same face of the substrate interposer.

9. The integrated circuit assembly of claim 1, wherein the integrated circuit package is a first integrated circuit package, the integrated circuit assembly further comprises a substrate interposer soldered to the printed circuit board in a location above the integrated circuit package, and the substrate interposer is coupled to the printed circuit board by a solder ball grid array patterned to surround the aperture on the printed circuit board.

10. The integrated circuit assembly of claim 1, wherein the printed circuit board further includes at least one attachment hole, the aperture is between the through-hole and the at least one attachment hole, and the attachment hole is to receive a locking push pin to secure the bottom-side or top-side thermal conduction element to the printed circuit board.

11. The integrated circuit assembly of claim 1, wherein the integrated circuit assembly is an edge card.

12. The integrated circuit assembly of claim 11, wherein a plurality of metal contact fingers are at an end of the printed circuit board, and the integrated circuit assembly further comprises:
   a circuit element soldered to the printed circuit board at a location between the aperture and the metal contact fingers.

13. The integrated circuit assembly of claim 12, wherein the end of the printed circuit board is a first end of the printed circuit board, the printed circuit board has a second end opposite the first end, and the aperture is proximate to the second end.

14. The integrated circuit assembly of claim 13, wherein the through-hole is at the second end.

* * * * *

UNITED STATES PATENT AND TRADEMARK OFFICE
CERTIFICATE OF CORRECTION

PATENT NO. : 11,147,153 B2  
APPLICATION NO. : 16/905587  
DATED : October 12, 2021  
INVENTOR(S) : Long Page 1 of 1

It is certified that error appears in the above-identified patent and that said Letters Patent is hereby corrected as shown below:

In the Claims

In Column 14, Claim 1, Line 31, delete "top-sided" and insert -- top-side --, therefor.

In Column 14, Claim 1, Line 33, delete "contracts" and insert -- contacts --, therefor.

Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*